(12) United States Patent
Kobayashi

(10) Patent No.: US 7,451,008 B2
(45) Date of Patent: Nov. 11, 2008

(54) MANAGEMENT METHOD AND SYSTEM FOR DEVICE REQUIRING MAINTENANCE

(75) Inventor: Tokumi Kobayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/597,390

(22) PCT Filed: Jan. 27, 2005

(86) PCT No.: PCT/JP2005/001565

§ 371 (c)(1),
(2), (4) Date: Jul. 24, 2006

(87) PCT Pub. No.: WO2005/071562

PCT Pub. Date: Aug. 4, 2005

(65) Prior Publication Data

US 2007/0168163 A1     Jul. 19, 2007

(30) Foreign Application Priority Data

Jan. 27, 2004 (JP) .............................. 2004/018117

(51) Int. Cl.
G06F 19/00 (2006.01)
G06F 7/00 (2006.01)
G06F 15/00 (2006.01)

(52) U.S. Cl. .................... 700/108; 700/66; 700/115; 700/121; 700/214; 702/184

(58) Field of Classification Search ............ 700/66, 700/83, 96, 108–110, 114–116, 121, 169, 700/174, 177, 214; 702/183–185
See application file for complete search history.

(56) References Cited

U.S. PATENT DOCUMENTS

| 5,400,497 | A  | * | 3/1995  | Watanabe et al. ............. 29/705  |
| 5,822,210 | A  | * | 10/1998 | Kobayashi et al. .......... 700/121   |
| 6,006,171 | A  |   | 12/1999 | Vines et al.                          |
| 6,609,041 | B1 | * | 8/2003  | Sanka et al. ................. 700/115 |
| 6,658,311 | B1 |   | 12/2003 | Doba                                  |
| 2001/0016848 | A1 |  | 8/2001  | Sekitani                              |

(Continued)

FOREIGN PATENT DOCUMENTS

EP        1128245        8/2001

(Continued)

OTHER PUBLICATIONS

English language Abstract of JP 2001-127487.

*Primary Examiner*—Sean P Shechtman
(74) *Attorney, Agent, or Firm*—Greenblum & Bernstein, P.L.C.

(57) ABSTRACT

A management method is provided for a removable device attached to an apparatus and to be removed for maintenance. Maintenance data for each removable device is stored in a data management unit. An identification code is given to each removable device. The identification code of the removable device is read and input and output together with information required for maintenance, via a mobile terminal. The maintenance data is sent and received between the mobile terminal and the data management unit via a personal handphone system radio relay device. Since the management method enables maintenance of the removable device to be performed via the mobile terminal, it is possible to easily manage the location and history of the removable device requiring maintenance.

12 Claims, 5 Drawing Sheets

U.S. PATENT DOCUMENTS

2003/0139176 A1 * 7/2003 Fujiwara et al. ............ 455/420
2004/0093102 A1   5/2004 Liiri et al.

FOREIGN PATENT DOCUMENTS

| | | |
|---|---|---|
| JP | 2001-127487 | 5/2001 |
| WO | 96/27171 | 9/1996 |
| WO | 02/31717 | 4/2002 |

* cited by examiner

MANAGEMENT METHOD AND SYSTEM FOR DEVICE REQUIRING MAINTENANCE

TECHNICAL FIELD

The present invention relates to a management method and a system for a device requiring maintenance, which is provided in each of component-mounting machines on a mounting line in a component-mounting plant, such as a parts feeder for feeding components or a suction nozzle for holding a component by suction. In each component-mounting machine, a plurality of parts feeders or suction nozzles may be provided.

BACKGROUND ART

In a typical plant for mounting electronic components, for example, a plurality of mounting lines are provided, each of which is formed by a plurality of component-mounting machines arranged in a line. In a large-scale plant, dozens of mounting lines are provided. In each component-mounting machine, a plurality of component feeding means (hereinafter, referred to as part feeders) each of which is arranged to successively feed one kind of components are provided in parallel and are arranged to repeat an operation in which a component fed from a selected one of the parts feeders is held by suction and is then mounted on a substrate. The parts feeder in each component-mounting machine has to be replaced in the case where shortage of components occurs in a component reel included in that parts feeder, the case where a mounting error frequently occurs, or the case where the type of circuit board to be manufactured is changed. Thus, in many facilities for mounting electronic components, there are a number of parts feeders, for example, several hundreds to several tens of thousands of parts feeders including replacement parts feeders. Each parts feeder requires regular inspection and maintenance in order to ensure reliability of its feeding operation. In addition, when the component-mounting rate of a parts feeder is low, for example, that parts feeder has to be repaired. However, for each of a number of parts feeders, the current location and the history such as the date of purchase, the maintenance date, and the component-mounting rate were not managed conventionally.

As a method for managing components, the following conventional method is known. In a plant for mounting electronic components, a barcode is put on a parts feeder as component-feeding means provided in a component-mounting machine. In that barcode, identification information of the corresponding parts feeder is recorded. A system server combines the identification information recorded in the barcode on the parts cassette, component-type information and information about the initial number of components that are recorded in a barcode put on a component reel mounted on the parts cassette, thereby creating replacement history information. Based on this replacement history information, components are managed. (See Japanese Patent Laid-Open Publication No. 2001-127487, for example.)

However, in the conventional plant for mounting electronic components, there are a number of parts cassettes and the location and history of each parts cassette are not managed. Thus, even if regular and efficient maintenance is tried in order to ensure a stable feeding operation, it is not possible to locate a parts cassette to be maintained or know the history of that parts cassette. This prevents accurate maintenance and makes it impossible to ensure that all the parts cassettes perform a reliable feeding operation. As a result, a situation where production is stopped because of an error of feeding components during production may be caused, and improvement of the production efficiency may be prevented. In addition to the parts cassette, the suction nozzle also has the same problem.

Japanese Patent Laid-Open Publication No. 2001-127487 discloses management of components that is performed by putting barcodes on a parts cassette and a component reel. However, that management method does not manage the parts cassette itself. That is, it is not possible to perform regular and efficient maintenance the parts cassette by managing the location and history of the parts cassette. In addition, even if that management method is re-formed so as to manage the parts cassette itself, the system structure becomes large-scale and the cost of equipment is increased, because the system server, the respective mounting machines of the mounting line, and a parts shelf are connected by a line.

Therefore, considering the aforementioned conventional problems, it is an object of the present invention to provide a management method and a system that easily manages location and history of a device that requires maintenance, such as a parts cassette and a suction nozzle of a component-mounting machine, and performs efficient and accurate maintenance.

DISCLOSURE OF THE INVENTION

In order to achieve the above object, the management method for a device requiring maintenance according to the present invention is a management method for a device that is mounted on or attached to a given apparatus and is to be removed from the apparatus to undergo maintenance such as keeping, inspection, and repair. The management method comprises: storing maintenance data for every device in a data management unit to be recordable and readable; giving an identification code to each device; reading an identification code of a device and inputting and outputting the read identification code together with information required for maintenance by means of a mobile terminal; and sending and receiving the maintenance data between the mobile terminal and the data management unit. In the management method, by inputting the identification code of the device by means of the mobile terminal, the maintenance data of that device is recorded into or read from the data management unit. Thus, it is possible to perform efficient and accurate maintenance for that device based on the maintenance data.

Moreover, the management system for a device requiring maintenance according to the present invention is a system for managing a device that is mounted on or attached to a given apparatus and is to be removed from the apparatus to undergo maintenance such as keeping, inspection, and repair. The management system comprises: a plurality of devices each of which has an identification code given thereto for identifying the corresponding device; a database for storing maintenance data for each device; a data management unit for recording and reading the maintenance data for each device into/from the database; a mobile terminal including reading means for reading an identification code of a device, and having a function of inputting and outputting the read identification code together with information required for maintenance; and communication means for sending and receiving the maintenance data between the mobile terminal and the data management unit. In the management system, by reading the identification code of the device by means of the mobile terminal, the maintenance data of that device is recorded into and read from the data management unit, and efficient and accurate maintenance is performed for that device based on the maintenance data. Moreover, the management system is achieved by a simple and inexpensive structure of equipment, i.e., only by providing the mobile terminal and the data management unit and constructing the database.

BEST MODE FOR CARRYING OUT THE INVENTION

An embodiment of the present invention is now described with reference to FIGS. 1 to 5. In this embodiment, a management method and a system for a device that requires maintenance according to the present invention are applied to management of a parts cassette as an exemplary parts feeder in a component-mounting plant.

Figure 1:
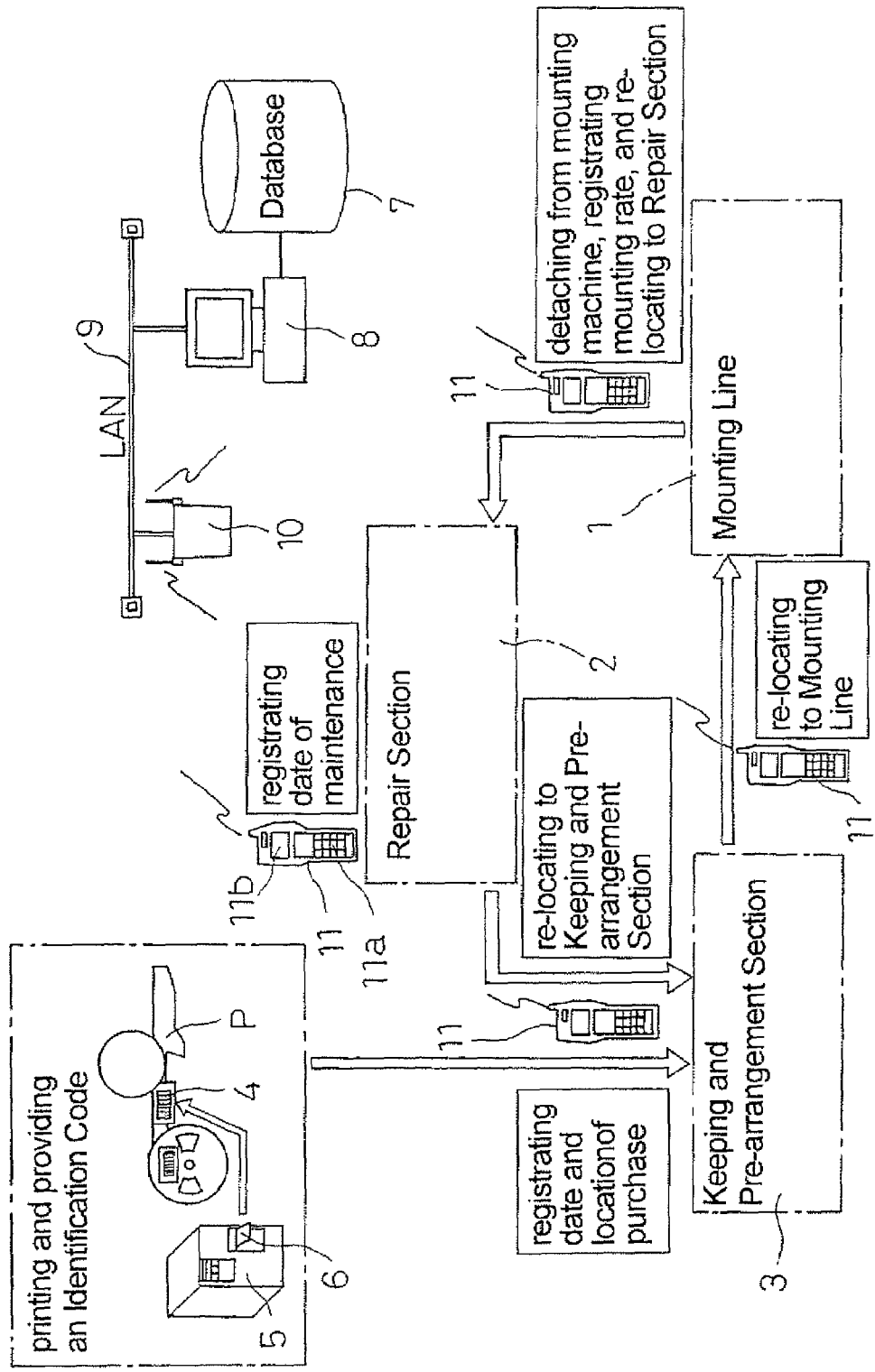
FIG. 1 shows the structure of a maintenance system for a parts cassette according to an embodiment of the present invention.
Figure 4:
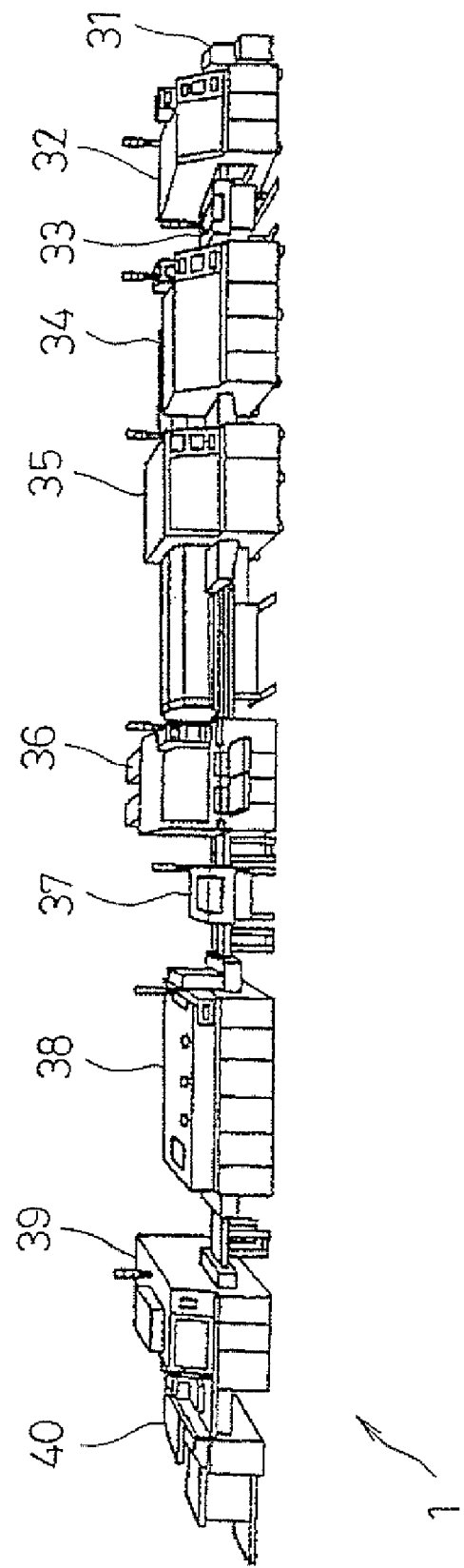
FIG. 4 is a perspective view of an exemplary mounting line in the embodiment of the present invention.

In FIG. 1, 1 denotes one or more mounting lines in the component-mounting plant; 2 denotes a repair section that repairs a parts cassette P detached from a component-mounting machine of the mounting line 1; and 3 denotes a keeping and pre-arrangement section that keeps the parts cassette P and makes pre-arrangement in order to attach the parts cassette P to the component-mounting machine. The mounting line 1 is formed by a plurality of component-mounting machines arranged in a line, as shown in FIG. 4. The mounting line 1, which is shown as an example, is formed by a substrate input machine 31, a creamed solder printing machine 32, an inspection machine 33, an adhesive applying machine 34, a high-speed mounting machine 35, a multifunction mounting machine 36, an inspection machine 37, a reflow device 38, an inspection machine 39, and a substrate recovery machine 40, which have identification codes respectively assigned thereto.

Figure 5:
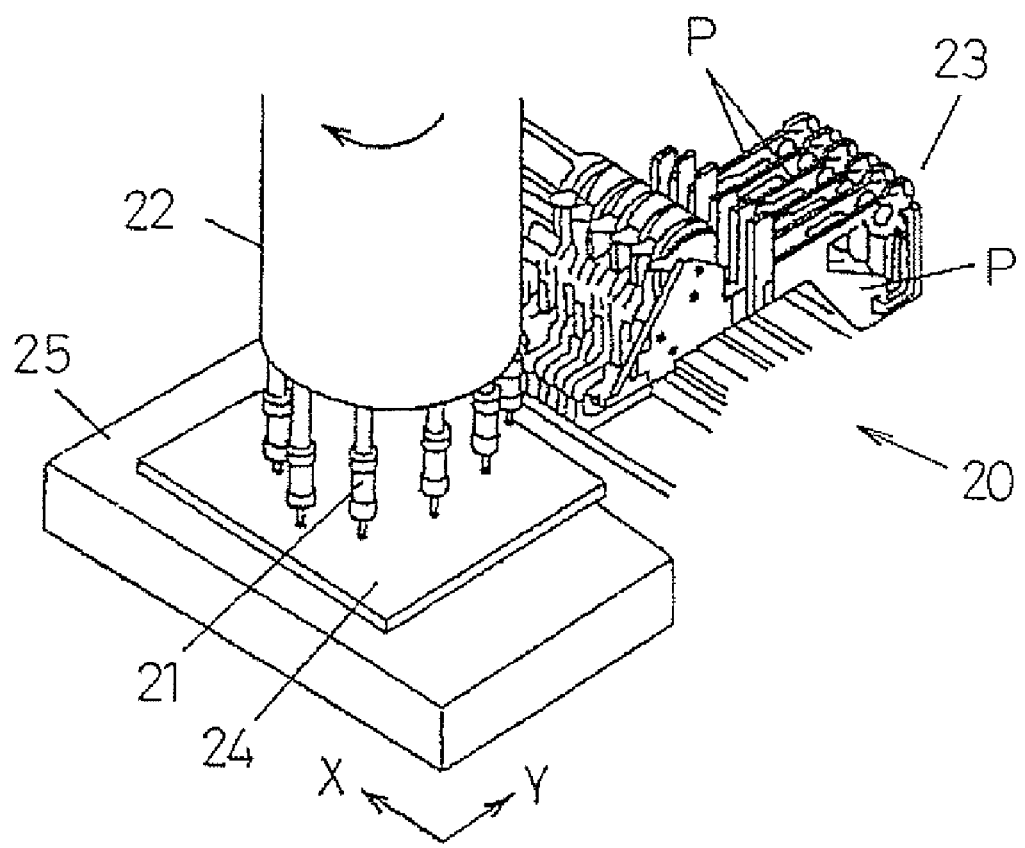
FIG. 5 is a perspective view of a rotary mounting machine as an exemplary component-mounting machine in the embodiment of the present invention.

As an exemplary component-mounting machine, a rotary mounting machine 20 shown in FIG. 5 is used. This rotary mounting machine 20 includes: a rotary head 22 having a plurality of suction nozzles 21; a component feeding unit 23 having a plurality of parts cassettes P; and an XY table 25 onto which a printed board 24 is placed. The XY table 25 aligns positioning of the printed board 24 with respect to the suction nozzle 21. In the rotary mounting machine 20, a component fed from a parts cassette P is held by suction at a predetermined position by the suction nozzle 21. The suction nozzle 21 holding the component is moved to a predetermined mounting position by an intermittent rotation of the rotary head 22, and is then moved up and down so as to mount the component on a predetermined position of the printed board 24 that has been positioned by the XY table 25. Please note that a plurality of parts cassettes P in this rotary mounting machine 20 are detachably attached to the component-feeding unit 23. Thus, in accordance with the type of component to be used, a parts cassette P storing that type of component is selected and attached. Similarly, the suction nozzle 21 is detachably attached to the rotary head 22 and therefore is replaced with another suction nozzle 21 that matches the type of component to be used in accordance with the type of component.

When a parts cassette P is newly carried into the component-mounting plant, a barcode 4 as an identification code for identifying that parts cassette P is given to that parts cassette P. More specifically, a label printer 5 prints a management label 6 in which the barcode 4 is printed, and the management label 6 is then put on a predetermined portion of the parts cassette P. The identification code is formed by a component number indicating the specification and performance of the parts cassette P and an individual number indicating what number component that parts cassette P is in components having the same component number.

Figure 2:
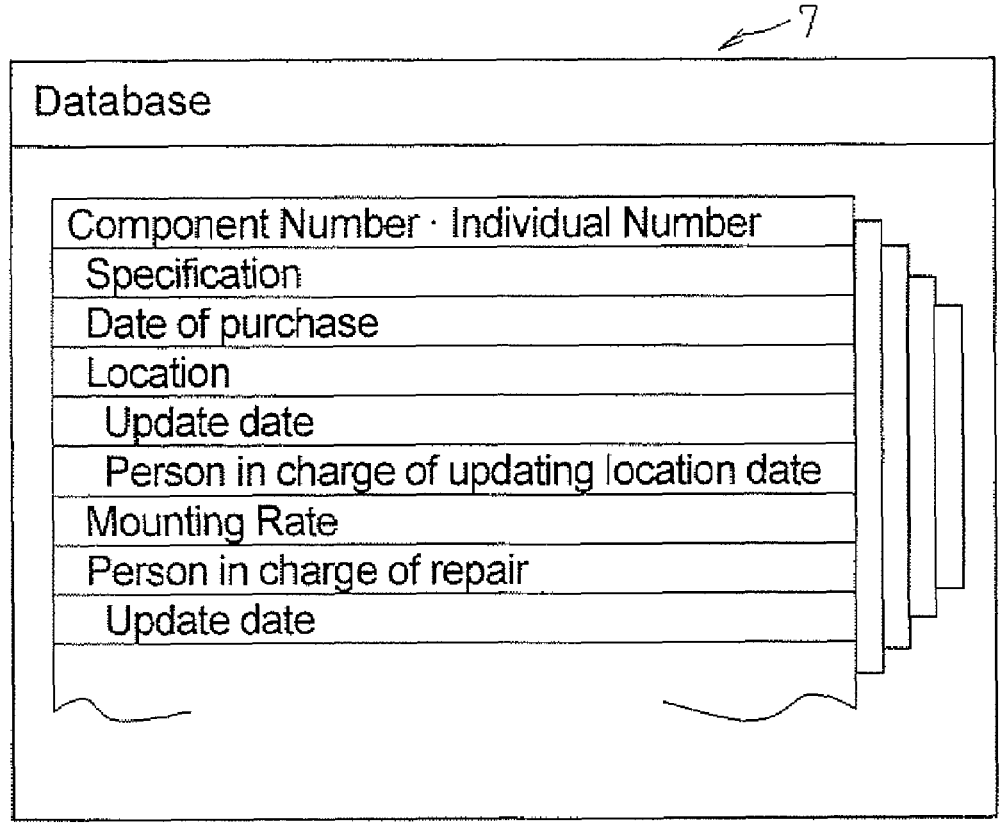
FIG. 2 is a diagram explaining a database in the embodiment of the present invention.

7 denotes a database. As shown in FIG. 2, the database 7 stores for every parts cassette P maintenance data containing location data and history data, for example, the component number and the individual number for identifying the parts cassette P, the specification and the date of purchase of the parts cassette P, location data indicating the location of the parts cassette P, the update date of the location data and a person in charge of updating the location data, a mounting rate when the parts cassette P is attached to the component-mounting machine, and a person in charge of repair and the update date thereof. 8 denotes a data management unit formed by a personal computer that records and reads the aforementioned maintenance data of each parts cassette P into/from the database 7. The data management unit 8 is connected to a PHS radio relay device 10 via a LAN 9.

11 denotes a mobile terminal. The mobile terminal 11 includes: a barcode reader (not shown) for reading the barcode 4; a key input portion 11a formed by various operating keys or input keys; a display portion 11b formed by a liquid crystal display for displaying data; a function of inputting and outputting the identification code read by the barcode reader together with location data and history data that are required for maintenance; and a function of sending and receiving data to/from the PHS radio relay device 10 via PHS radio waves. Thus, the mobile terminal 11 is formed to send and receive data to/from the data management unit 8 via the PHS radio relay device 10 and the LAN 9.

Figure 3:
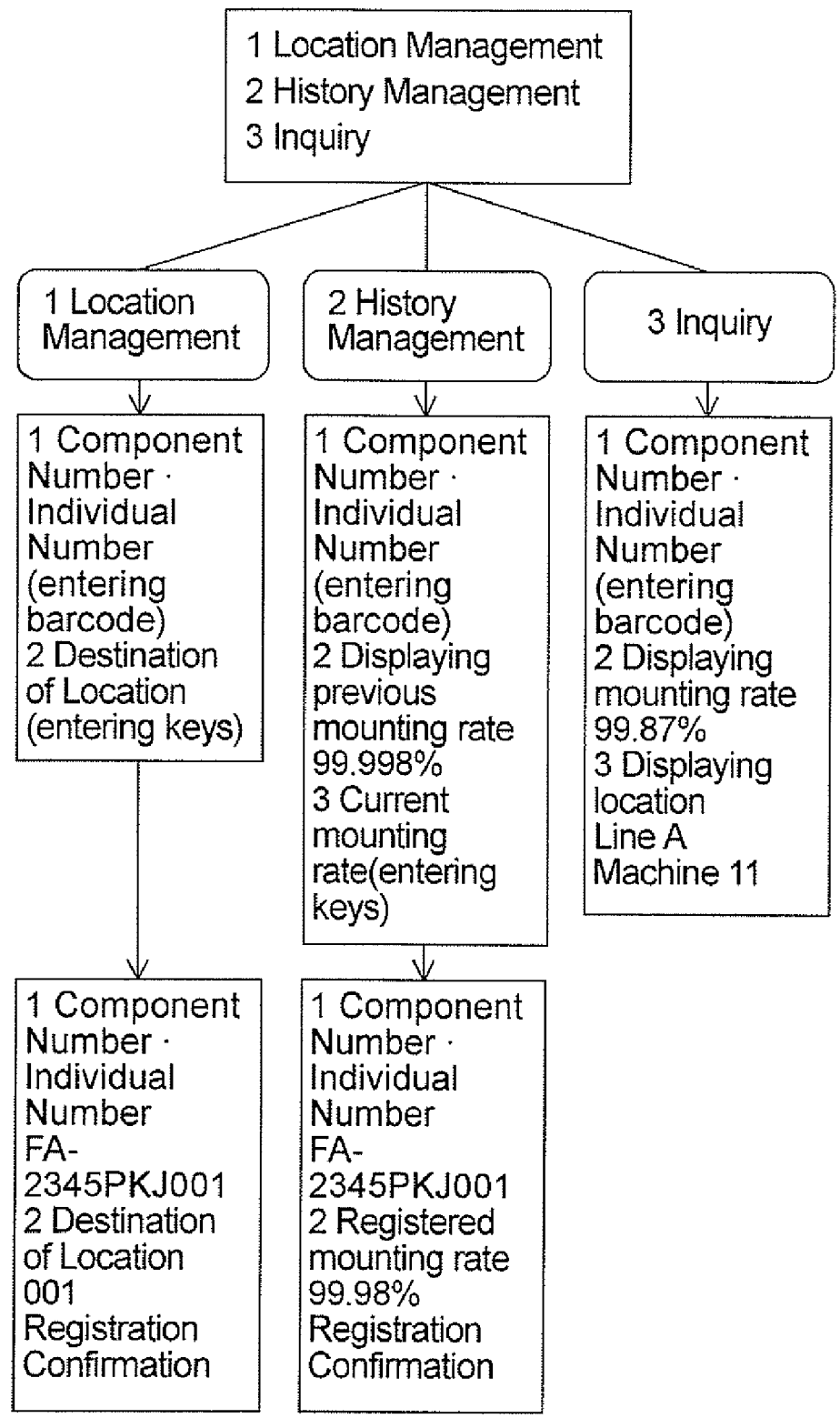
FIG. 3 is a diagram showing processes and display screens in the respective processes on a mobile terminal in the embodiment of the present invention.

In the above structure, when a new parts cassette P is carried in and a barcode 4 indicating the identification code of that parts cassette P is given to that parts cassette P, the barcode 4 is read by means of the mobile terminal 11 and the location of the parts cassette P in the keeping and pre-arrangement section 3 is input by using keys. In this input, as shown in FIG. 3, "1 Location Management" is selected in a function selecting menu displayed on the display portion 11b. Then, input of the component number, the individual number, and the destination location is instructed. When the component number and the individual number are input by the barcode reader and the destination location is input by using keys of the key input portion 11a, the component number, the individual number, and the destination location thus input are displayed. By pressing a registration confirmation key in this state, the input data is thus sent from the mobile terminal 11 and the location of the parts cassette P is stored in the database 7 via the PHS radio relay device 10, the LAN 9, and the data management unit 8.

In the case where the parts cassette P is moved from the keeping and pre-arrangement section 3 and is attached to the component-mounting machine of the mounting line 1, the barcode 4 is read by the mobile terminal 11 in the same manner as that described above and the location of the component-mounting machine to which that parts cassette P is attached is input by using keys, thereby the location of that parts cassette P is stored in the database 7.

Next, a case is considered where the parts cassette P is detached from the component-mounting machine and is moved to the repair section 2, because of shortage of components, change of the type of circuit board, or the like. In this case, as shown in FIG. 3, "2 History Management" is selected in the function selecting menu displayed on the display portion 11b. Then, input of the component number and the individual number is instructed. When those numbers are input by the barcode reader, the previous mounting rate is displayed. At the same time, input of the current mounting rate is instructed. By inputting the current mounting rate which is obtained by reading a control display of the component-mounting machine, using keys and then pressing the registration confirmation key, the input data is thus sent from the mobile terminal 11 and the history data of that parts cassette P is stored in the database 7 via the PHS radio relay device 10, the LAN 9, and the data management unit 8.

In the case where the parts cassette P is repaired in the repair section 2, the barcode 4 of that parts cassette P is read by the mobile terminal 11 in the same manner as that described above and the date of repair (maintenance) and a person in charge of the repair are input. As a result, the repair history of the parts cassette P is stored in the database 7.

In the case where the parts cassette P is moved from the repair section 2 to the keeping and pre-arrangement section 3 after completion of maintenance, the location of the parts cassette P in the keeping and pre-arrangement section 3 is input by using keys as in the aforementioned manner, thereby the location of the parts cassette P is stored in the database 7.

Moreover, in case of inquiring about the location or history of any given parts cassette P, as shown in FIG. 3, "3 Inquiry" is selected in the function selecting menu displayed on the display portion 11b. Then, input of the component number and the individual number is instructed. When a barcode corresponding to that parts cassette P in a barcode table is read by the barcode reader of the mobile terminal 11 and is input, the mobile terminal 11 accesses the database 7 via the PHS radio relay device 10, the LAN 9, and the data management unit 8 and reads out maintenance data of that parts cassette P. The maintenance data that is related to the history and the current location such as the location data and the mounting rate is displayed on the display portion 11b of the mobile terminal 11. In this manner, even if the parts cassette P that is an object of inquiry is located anywhere, it is possible to locate that parts cassette P and know the history data thereof. Therefore, based on the thus obtained maintenance data, accurate maintenance is performed for that parts cassette P.

In the above embodiment, the maintenance method and the system for the parts cassette P as an exemplary parts feeder that is a device requiring maintenance. However, the present invention maybe applied to various types of parts feeders, other than the shown parts feeder. Moreover, the present invention is not limited to the parts feeder, and may be also applied to maintenance of the suction nozzle 21 in the rotary mounting machine 20 as an exemplary component-mounting machine. In addition, the present invention achieves great effects when being applied to various types of component-mounting machines such as an XY robot mounting machine. Furthermore, the present invention may be suitably applied to various devices other than the component-mounting machine, each of which is mounted on or attached to a given apparatus and is to be removed from that apparatus to undergo maintenance such as keeping, inspection, and repair. In addition, other than the barcode, an IC tag or the like may be used. In this case, the same effects are also achieved.

INDUSTRIAL APPLICABILITY

As described above, the management method for a device that requires maintenance according to the present invention, includes: storing maintenance data for each device in a data management unit to be recordable and readable; giving an identification code to each device; reading an identification code of a device and inputting and outputting the read identification code together with information required for maintenance by means of a mobile terminal; and sending and receiving the maintenance data between the mobile terminal and the data management unit. In the management method, recording and reading of the maintenance data of the device into/from the data management unit are performed by means of the mobile terminal, and efficient and accurate maintenance is performed based on the maintenance data. Therefore, the management method is useful for managing a parts cassette and an suction nozzle in a component-mounting plant, and other devices which are mounted on or attached to various types of apparatus and are to be removed to undergo maintenance such as keeping, inspection, and repair.

The invention claimed is:

1. A management method for a removable device, including a parts cassette or a suction nozzle, that is attachable to an apparatus and is removable from the apparatus, the management method comprising:
storing maintenance data for the removable device in a computer readable medium of a data management unit, the maintenance data including location data indicating the location of the removable device in a component-mounting plant;
giving an identification code to the removable device;
reading an identification code of the removable device and inputting and outputting the read identification code together with the maintenance data using a mobile terminal; and
sending and receiving the maintenance data between the mobile terminal and the data management unit;
wherein reading of the identification code of the removable device and inputting of a destination location by the mobile terminal occurs every time the location of the removable device changes;
wherein the data management unit stores the received maintenance data including the location data for each identification code of the removable device;
wherein the maintenance data further includes history data including performance of the removable device and history of repair.

2. The management method according to claim 1, wherein the mobile terminal having a reading function for the identification code is configured to read the identification code of the removable device.

3. The management method according to claim 2, wherein the identification code of each removable device comprises a barcode, and
wherein a barcode reader provided to the mobile terminal reads the barcode.

4. The management method according to claim 1, wherein the apparatus is a component-mounting machine, and
wherein the removable device is a parts feeder for supplying a component or a suction nozzle for holding a component by suction.

5. The management method according to claim 1, wherein the location data, which is inputted via the mobile terminal, is stored in the data management unit, when the removable device is attached to the apparatus or the removable device is removed from the apparatus.

6. The management method according to claim 1, wherein the location data of the removable device stored in the data management unit is read by inquiring, via the mobile terminal, and the read location data is displayed on a display portion of the mobile terminal.

7. The management method according to claim 2, wherein the apparatus is a component-mounting machine, and wherein the removable device is a parts feeder for supplying a component or a suction nozzle for holding a component by suction.

8. The management method according to claim 3, wherein the apparatus is a component-mounting machine, and wherein the removable device is a parts feeder for supplying a component or a suction nozzle for holding a component by suction.

9. A system for managing a removable device that is attachable to an apparatus and is removable from the apparatus, the management system comprising:

a plurality of removable devices each of which has an identification code given thereto for identifying the corresponding removable device;

a database for storing maintenance data for each removable device, the maintenance data including location data indicating the location of the removable device;

a data management unit for recording and reading the maintenance data for each removable device into/from the database;

a mobile terminal including a reading device for reading an identification code of a removable device, and inputting and outputting the read identification code together with the maintenance data; and a communication device for sending and receiving the maintenance data between the mobile terminal and the data management unit;

wherein reading of the identification code of the removable device and inputting of the a destination location by the mobile terminal occurs every time the location of the removable device changes;

wherein the data management unit stores the received maintenance data including the location data for each of the identification codes of the removable devices;

wherein the maintenance data further includes history data including performance of the removable device and history of repair.

10. The system for managing a removable device according to claim 9, wherein the mobile terminal includes a barcode reader as the reading device configured to read the identification codes.

11. The system for managing a removable device according to claim 9, wherein the communication device comprises a personal handphone system (PHS) radio communication device.

12. The system for managing a removable device according to claim 10, wherein the communication device comprises a personal handphone system (PHS) radio communication device.

* * * * *